United States Patent
Barone

(10) Patent No.: US 12,037,685 B2
(45) Date of Patent: Jul. 16, 2024

(54) LIQUID CHROMATOGRAPHY SYSTEM AND COMPONENT

(71) Applicant: SILCOTEK CORP., Bellefonte, PA (US)

(72) Inventor: Gary A. Barone, State College, PA (US)

(73) Assignee: Silcotek Corp, Bellefonte, PA (US)

(*) Notice: Subject to any disclaimer, the term of this patent is extended or adjusted under 35 U.S.C. 154(b) by 380 days.

(21) Appl. No.: 17/411,545

(22) Filed: Aug. 25, 2021

(65) Prior Publication Data

US 2021/0381105 A1 Dec. 9, 2021

Related U.S. Application Data

(63) Continuation of application No. 16/870,034, filed on May 8, 2020, now Pat. No. 11,131,020, which is a continuation of application No. 15/755,962, filed as application No. PCT/US2016/049647 on Aug. 31, 2016, now Pat. No. 10,876,206.

(60) Provisional application No. 62/212,868, filed on Sep. 1, 2015.

(51) Int. Cl.
   - *C23C 16/24* (2006.01)
   - *C23C 16/455* (2006.01)
   - *C23C 16/04* (2006.01)

(52) U.S. Cl.
   CPC ........ *C23C 16/45523* (2013.01); *C23C 16/24* (2013.01); *C23C 16/045* (2013.01)

(58) Field of Classification Search
   None
   See application file for complete search history.

(56) References Cited

U.S. PATENT DOCUMENTS

| | | |
|---|---|---|
| 4,173,661 A | 11/1979 | Bourdon |
| 4,402,997 A | 9/1983 | Hogan et al. |
| 4,560,589 A | 12/1985 | Endou et al. |
| 4,579,752 A | 4/1986 | Dubois et al. |
| 4,671,997 A | 6/1987 | Galasso et al. |
| 4,684,542 A | 8/1987 | Jasinski et al. |
| 4,714,632 A | 12/1987 | Cabrera et al. |
| 4,720,395 A | 1/1988 | Foster |
| 4,741,964 A | 5/1988 | Haller |
| 4,749,631 A | 6/1988 | Haluska et al. |
| 4,753,856 A | 6/1988 | Haluska et al. |
| 4,792,460 A | 12/1988 | Chu et al. |
| 4,842,888 A | 6/1989 | Haluska et al. |
| 4,956,204 A | 9/1990 | Amazawa et al. |
| 5,128,515 A | 7/1992 | Tanaka |
| 5,141,567 A | 8/1992 | Tahara |

(Continued)

FOREIGN PATENT DOCUMENTS

| | | |
|---|---|---|
| CN | 100347834 | 11/2007 |
| CN | 104294236 A | 1/2015 |

(Continued)

*Primary Examiner* — Daniel J. Schleis
(74) *Attorney, Agent, or Firm* — Saxton & Stump, LLC

(57) ABSTRACT

Liquid chromatography systems and liquid chromatography components are disclosed. In an embodiment, a liquid chromatography system includes a liquid chromatography component. The liquid chromatography component includes a substrate and an amorphous coating on the substrate. The amorphous coating has a base layer and a surface layer. The base layer includes carboxysilane.

20 Claims, 1 Drawing Sheet

(56) References Cited

U.S. PATENT DOCUMENTS

| | | |
|---|---|---|
| 5,160,544 A | 11/1992 | Garg et al. |
| 5,208,069 A | 5/1993 | Clark et al. |
| 5,249,554 A | 10/1993 | Tamor et al. |
| 5,250,451 A | 10/1993 | Chouan |
| 5,270,082 A | 12/1993 | Lin et al. |
| 5,299,731 A | 4/1994 | Liyanage et al. |
| 5,413,813 A | 5/1995 | Cruse et al. |
| 5,474,613 A | 12/1995 | Pickering et al. |
| 5,480,677 A | 1/1996 | Li et al. |
| 5,481,135 A | 1/1996 | Chandra et al. |
| 5,510,146 A | 4/1996 | Miyasaki |
| 5,562,952 A | 10/1996 | Nakahigashi et al. |
| 5,563,102 A | 10/1996 | Michael |
| 5,756,404 A | 5/1998 | Friedenreich et al. |
| 5,818,071 A | 10/1998 | Loboda et al. |
| 5,825,078 A | 10/1998 | Michael |
| 5,874,368 A | 2/1999 | Laxman et al. |
| 5,939,333 A | 8/1999 | Hurley et al. |
| 5,981,403 A | 11/1999 | Ma et al. |
| 5,994,675 A | 11/1999 | Bethune et al. |
| 5,997,742 A | 12/1999 | Gjerde et al. |
| 6,157,003 A | 12/2000 | Drimer |
| 6,159,871 A | 12/2000 | Loboda et al. |
| 6,312,808 B1 | 11/2001 | Veerasamy et al. |
| 6,319,556 B1 | 11/2001 | Olsen et al. |
| 6,337,459 B1 | 1/2002 | Terwijn et al. |
| 6,416,577 B1 | 7/2002 | Suntoloa et al. |
| 6,416,816 B2 | 7/2002 | Veerasamy et al. |
| 6,444,268 B2 | 9/2002 | Lefcowitz et al. |
| 6,444,326 B1 | 9/2002 | Smith |
| 6,472,076 B1 | 10/2002 | Hacker |
| 6,511,760 B1 | 1/2003 | Barone et al. |
| 6,531,182 B2 | 3/2003 | Veerasamy et al. |
| 6,531,398 B1 | 3/2003 | Gaillard et al. |
| 6,531,415 B1 | 3/2003 | Yang et al. |
| 6,566,281 B1 | 5/2003 | Buchanan et al. |
| 6,592,993 B2 | 7/2003 | Veerasamy et al. |
| 6,593,655 B1 | 7/2003 | Loboda et al. |
| 6,630,413 B2 | 10/2003 | Todd |
| 6,765,178 B2 | 7/2004 | Shang et al. |
| 6,998,579 B2 | 2/2006 | Inagawa et al. |
| 7,022,948 B2 | 4/2006 | Shang et al. |
| 7,070,833 B2 | 7/2006 | Smith et al. |
| 7,192,626 B2 | 3/2007 | Dussarrat et al. |
| 7,429,717 B2 | 9/2008 | Yudovsky |
| 7,510,935 B2 | 3/2009 | Lee et al. |
| 7,860,379 B2 | 12/2010 | Hunter et al. |
| 7,867,627 B2 | 1/2011 | Smith et al. |
| 7,875,556 B2 | 1/2011 | Xiao et al. |
| 8,092,770 B2 | 1/2012 | Betz et al. |
| 8,286,571 B2 | 10/2012 | Driver et al. |
| 8,357,430 B2 | 1/2013 | Dussarrat et al. |
| D689,107 S | 9/2013 | Grove |
| 8,552,346 B2 | 10/2013 | Ambal et al. |
| 8,563,445 B2 | 10/2013 | Liang et al. |
| D713,024 S | 9/2014 | Grove et al. |
| 8,822,018 B2 | 9/2014 | Thoumazet et al. |
| 8,980,382 B2 | 3/2015 | Ingle et al. |
| 9,340,880 B2 | 5/2016 | Mattzela |
| 9,777,368 B2 | 10/2017 | Smith et al. |
| 9,915,001 B2 | 3/2018 | Yuan et al. |
| 9,975,143 B2 | 5/2018 | Smith et al. |
| 10,087,521 B2 | 10/2018 | Yuan et al. |
| 10,316,408 B2 | 6/2019 | Smith et al. |
| 10,323,321 B1 | 6/2019 | Yuan et al. |
| 10,487,402 B2 | 11/2019 | Yuan et al. |
| 10,487,403 B2 | 11/2019 | Smith |
| 10,604,660 B2 | 3/2020 | Smith et al. |
| 2001/0049203 A1 | 12/2001 | Kim et al. |
| 2001/0055672 A1 | 12/2001 | Todd |
| 2002/0045009 A1 | 4/2002 | Tobaski et al. |
| 2003/0152701 A1 | 8/2003 | Kang et al. |
| 2003/0186000 A1 | 10/2003 | Li et al. |
| 2004/0037956 A1 | 2/2004 | Yang |
| 2004/0175579 A1 | 9/2004 | Smith et al. |
| 2005/0064684 A1 | 3/2005 | Todd et al. |
| 2005/0100670 A1 | 5/2005 | Dussarrat et al. |
| 2005/0183663 A1 | 8/2005 | Cheng et al. |
| 2005/0271893 A1 | 12/2005 | Kobrin et al. |
| 2006/0216952 A1 | 9/2006 | Bhanap et al. |
| 2007/0042118 A1 | 2/2007 | Yoo |
| 2007/0243317 A1 | 10/2007 | DuBois et al. |
| 2007/0281448 A1 | 12/2007 | Chen et al. |
| 2009/0078202 A1 | 3/2009 | Strikovski et al. |
| 2009/0173146 A1* | 7/2009 | Pursch .............. G01N 30/30 73/61.52 |
| 2009/0230558 A1 | 9/2009 | Matsuoka |
| 2010/0248496 A1 | 9/2010 | Wei et al. |
| 2011/0259879 A1 | 10/2011 | Hanawa et al. |
| 2011/0305784 A1 | 12/2011 | Lee |
| 2012/0045954 A1 | 2/2012 | Bleecher et al. |
| 2012/0219727 A1 | 8/2012 | Gandhiraman et al. |
| 2012/0251797 A1 | 10/2012 | Smith et al. |
| 2013/0244025 A1 | 9/2013 | Smith et al. |
| 2014/0256156 A1 | 9/2014 | Harada et al. |
| 2014/0370300 A1* | 12/2014 | Smith ................ C23C 16/46 427/255.393 |
| 2015/0024152 A1* | 1/2015 | Carr .................. B01D 15/22 428/34.1 |
| 2015/0030885 A1 | 1/2015 | Smith |
| 2015/0206795 A1 | 7/2015 | Hasebe et al. |
| 2015/0283307 A1 | 10/2015 | Smith et al. |
| 2015/0371991 A1 | 12/2015 | Nobuto |
| 2016/0049309 A1 | 2/2016 | Tapily et al. |
| 2016/0354758 A1 | 12/2016 | Gorecki et al. |
| 2018/0318742 A1 | 11/2018 | Bevis |
| 2019/0003044 A1 | 1/2019 | Yuan |
| 2019/0086371 A1 | 3/2019 | Lauber et al. |

FOREIGN PATENT DOCUMENTS

| | | |
|---|---|---|
| DE | 2523257 | 12/1976 |
| DE | 2829568 | 1/1980 |
| EP | 0911307 A1 | 4/1999 |
| EP | 1150345 A2 | 4/2001 |
| EP | 0996767 B1 | 9/2003 |
| EP | 1790757 A1 | 5/2007 |
| EP | 1988190 A2 | 11/2008 |
| GB | 2395492 A | 5/2004 |
| JP | 2012138627 A | 7/2012 |
| JP | 2013227628 A | 11/2013 |
| WO | 9902757 A1 | 1/1999 |
| WO | 0136190 A1 | 5/2001 |
| WO | 2009032488 A1 | 3/2009 |
| WO | 2009143618 A1 | 12/2009 |
| WO | 2010125926 A1 | 4/2010 |
| WO | 2010079299 A1 | 7/2010 |
| WO | 2011056550 A1 | 5/2011 |
| WO | 2012047945 A2 | 4/2012 |

* cited by examiner

LIQUID CHROMATOGRAPHY SYSTEM AND COMPONENT

PRIORITY

The present application is a non-provisional continuation patent application claiming priority and benefit of U.S. provisional patent application No. 62/212,868, filed on Sep. 1, 2015 and directed to "BATCH THERMAL CVD SILICON PARTICULATE REDUCTION AND/OR ELIMINATION," PCT Patent Application PCT/US2016/049647, filed on Aug. 31, 2016 and directed to "THERMAL CHEMICAL VAPOR DEPOSITION COATING," and U.S. non-provisional patent application Ser. No. 15/755,962, filed on Feb. 27, 2018 and directed to "THERMAL CHEMICAL VAPOR DEPOSITION COATING," now U.S. Pat. No. 10,876,206, and U.S. non-provisional patent application Ser. No. 16/870,034, filed on May 8, 2020 and directed to "LIQUID CHROMATOGRAPHY SYSTEM AND COMPONENT", all of which are incorporated by reference in their entirety.

FIELD OF THE INVENTION

The present invention is directed to liquid chromatography systems and liquid chromatography components. More particularly, the present invention is directed to such systems/components having an amorphous coating.

BACKGROUND OF THE INVENTION

Silicon has been applied to various surfaces through thermal chemical vapor deposition. Silicon has been applied through static processes involving pump and purge cycling of a reaction vessel, with periods of a gaseous soak within the reaction vessel. Alternatively, silicon has been applied in flow-through systems that involve constant flow of a gas through a reaction chamber, which do not include the gaseous soak and include features that do not allow conditions for flow-through systems to translate to conditions for systems that are not flow-through.

The silicon applied by static processes and by flow-through processes provide various improvements in various applications. Such applications have included flow-paths, fittings, fixtures, connectors, and other components. Flow-through processes allow for a constant or substantially constant concentration of a precursor gas to contact a surface, which is desirable because it allows for coatings to be applied with no gas phase nucleation. However, such flow-through processes are limited to line-of-sight techniques that coat surfaces within a direct line or substantially close to the direct line. Such flow-through processes are expensive and wasteful by having an over-abundance of the gas precursor that does not deposit on such surfaces.

Atomic layer deposition allows coating of regions that are not line-of-sight or close to a direct line. However, atomic layer deposition is a single layer process that has substantial economic challenges due to the prolonged processing conditions required to achieve coating.

Prior techniques of using thermal chemical vapor deposition have addressed above drawbacks of flow-through techniques and atomic layer deposition. However, many of the prior techniques produce gas phase nucleation based upon particle-particle collisions during the reaction process. The gas phase nucleation forms a dust, for example, a silicon dust when silane is thermally reacted.

U.S. Pat. No. 6,511,760, which is incorporated by reference in its entirety, teaches processes and vessels that allow thermal chemical vapor deposition that is substantially free of silicon dust. Such levels are of a concentration below that in which silicon dust can settle on a surface, compromise the integrity of the silicon layer formed on a metal surface, and/or create a physical barrier between successive layers of silicon.

Certain industries are extremely sensitive. They require reproducibility that has previously been considered to be beyond the functional possibility for thermal chemical vapor deposition and were only capable of being satisfied through wasteful flow-through techniques. For example, certain industries have needs relating to silicon dust concentration are beyond that which those in the thermal chemical vapor deposition industry would consider to be substantially free of dust. Although the amount of dust may be at levels below in which silicon dust can settle on the surface, compromise the integrity of the silicon layer formed on the metal surface, and/or create a physical barrier between successive layers of silicon, such levels can be too high for certain industries.

Coated articles and thermal chemical vapor deposition processes that shows one or more improvements in comparison to the prior art would be desirable in the art.

BRIEF DESCRIPTION OF THE INVENTION

In an embodiment, a liquid chromatography system includes a liquid chromatography component. The liquid chromatography component includes a substrate and an amorphous coating on the substrate. The amorphous coating has a base layer and a surface layer. The base layer includes carboxysilane.

Other features and advantages of the present invention will be apparent from the following more detailed description, taken in conjunction with the accompanying drawing which illustrates, by way of example, the principles of the invention.

BRIEF DESCRIPTION OF THE DRAWING

Wherever possible, the same reference numbers will be used throughout the drawing to represent the same parts.

DETAILED DESCRIPTION OF THE INVENTION

Provided are coated articles and thermal chemical vapor deposition processes. Embodiments of the present disclosure, for example, in comparison to concepts failing to include one or more of the features disclosed herein, increase consistency/repeatability of coating, improve aesthetics, modify microstructure, modify optical properties, modify porosity, modify corrosion resistance, modify gloss, modify surface features, permit more efficient production of coatings, permit coating of a wide range of geometries (for example, narrow channels/tubes, three-dimensionally complex geometries, and/or hidden or non-line-of-site geometries, such as, in needles, tubes, probes, fixtures, complex planar and/or non-planar geometry articles, simple non-planar and/or planar geometry articles, and combinations thereof), reduce or eliminate defects/microporosity, permit coating of a bulk of articles, are capable or being used in or replacing components that are used in industries traditionally believed to be too sensitive for processes that are not flow-through processes (for example, based upon compositional purity, presents of contaminants, thickness uniformity, and/or amount of gas phase nucleation embedded within), or permit a combination thereof.

Figure 1:
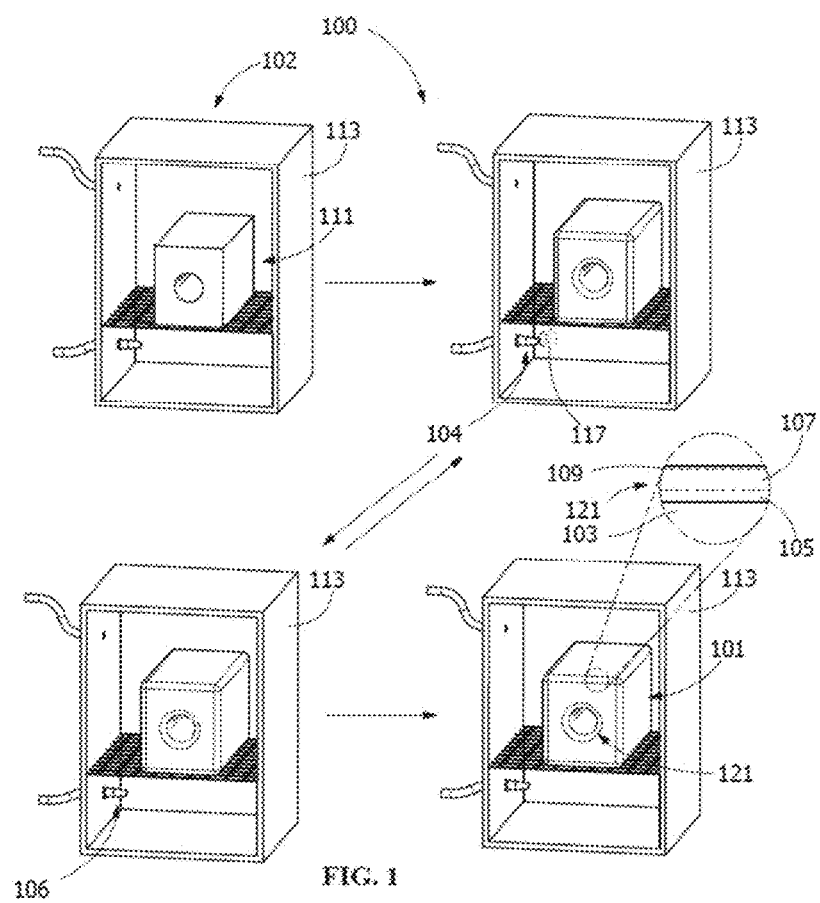
FIG. 1 is a schematic perspective view of a thermal chemical vapor deposition coating process, according to an embodiment of the disclosure.

Referring to FIG. 1, a thermal chemical vapor deposition ("CVD") process 100 produces a coated article 101, for example, having features and properties unique to being produced through the thermal CVD process, according to the disclosure, which is a static process using an enclosed chamber or enclosed vessel 113 (for example, within the enclosed chamber) contrasted to flowable chemical vapor deposition that has concurrent flow of a precursor into and out of a chamber. As used herein, the phrase "thermal CVD" or "thermal chemical vapor deposition" refers to a reaction and/or decomposition of one or more gases, for example, in a starved reactor configuration, and is distinguishable from plasma-assisted CVD, radical-initiated CVD, and/or catalyst-assisted CVD, sputtering, atomic layer deposition (which is limited to a monolayer molecular deposition per cycle in contrast being capable of more than one layer of molecular deposition), and/or epitaxial growth (for example, growth at greater than 700° C.).

The coated article 101 is produced from an uncoated article 111 and includes a substrate 103 (for example, not a silicon wafer) and one or more layers, such as, a base layer 105 in contact with the substrate 103, one or more interlayers 107 in contact with the base layer 105, and a surface layer 109 in contact with the interlayer 107 (or the outermost of the plurality of the interlayers 107). The base layer 105, the interlayer(s) 107, and the surface layer 109 define a coating 121. The coating 121 is on the coated article 101 on regions that are unable to be concurrently coated through line-of-sight techniques. In a further embodiment, the coating 121 is on regions that are unable to be coated concurrently or sequentially through line-of-sight techniques.

In one embodiment, the process 100 includes positioning one or a plurality of uncoated article(s) 111 within the enclosed vessel 113 (step 102). In further embodiments, the positioning (step 102) is manually with the articles 111 being arranged in a vertical (stacked) orientation separated by supports (and thus obstructed from line-of-sight), arranged laterally or perpendicular to gravity (for example, with all or most openings being perpendicular to gravity), arranged in an overlapping manner that reduces the amount of volume available for gas phase nucleation, of a combination thereof.

After the positioning (step 102), the process 100 includes introducing a silicon-containing precursor gas to the enclosed vessel 113 (step 104), for example, as a first aliquot, then gaseously soaking the uncoated article(s) 111 (step 106) at a temperature above the thermal decomposition temperature of the silicon-containing precursor gas to produce the base layer 105 of the coated article 101. The process 100 further includes repeating the introducing of the silicon-containing precursor gas (step 104), for example, as a second aliquot, or introducing a different silicon-containing precursor gas, to produce the interlayer(s) 107 and the surface layer 109. The gaseously soaking (step 106) is at a temperature above the thermal decomposition temperature of the silicon-containing precursor or the different silicon-containing precursors. The process 100 produces the coating 121.

Figure 2:
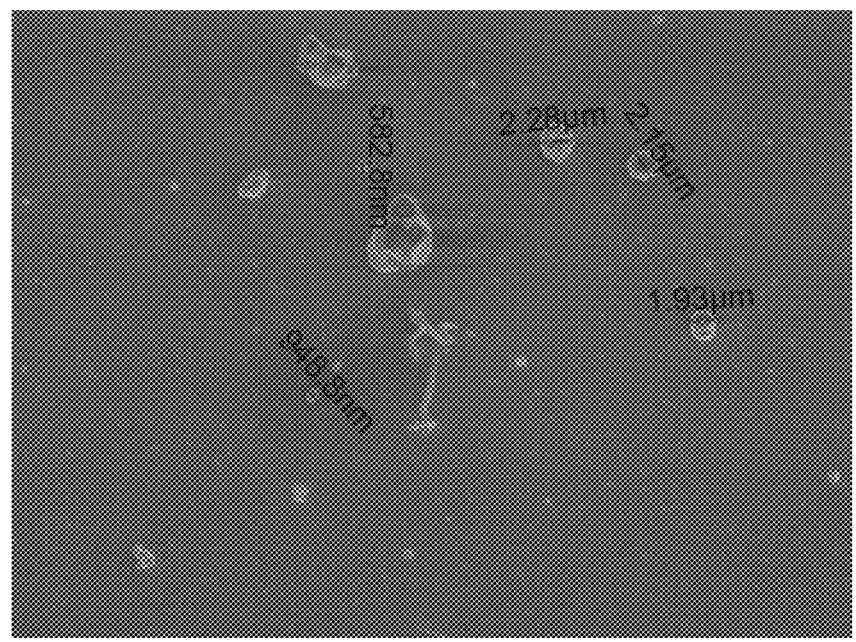
FIG. 2 is a micrograph of an exemplary coating, according to an embodiment of the disclosure.

The coating 121 has a concentration of particulate from gas phase nucleation (particle to particle collisions) that is below a desired level. Referring to FIG. 2, in one embodiment, the concentration per 100 square micrometers is fewer than 6 particles having a dimension of greater than 0.5 micrometers. Further embodiments have a concentration, per 100 square micrometers, of between 2 and 4 of the particles having a dimension of greater than 2 micrometers, fewer than 3 of the particles having a dimension of greater than 2 micrometers, fewer than 3 of the particles having a dimension of greater than 2 micrometers and fewer than 4 of the particles having a dimension of greater than 1.5 micrometers, or any suitable combination, sub-combination, range, or sub-range therein. In a further embodiment, the coating 121 has no particles of silicon dust formed from gas phase nucleation that are greater than 3 micrometers.

The concentration of the particulate from the gas phase nucleation (referred to as silicon dust) is controlled by balancing competing factors of the process 100. Such mechanisms include adsorption, nucleation, transport, surface diffusion, re-adsorption, and desorption. In general, two competing concepts during the process 100 occur: gas phase nucleation and deposition. Gas phase nucleation or particle-to-particle collisions occur at a greater rate when molecules have a greater distance to travel before contacting the substrate 103.

The average distance that molecules travel is referred to as the mean free path. The mean free path for a cylinder may be represented by either of the following:

$$\frac{1}{\pi d^2 n_V} \quad \text{(Equation 1)}$$

where $n_V$ is the number of molecules per unit volume and d is the diameter of the gas molecules. Other geometries are much more complicated.

In one embodiment, the process includes having a mean free path that is substantially larger than the distance to the substrate 103, thereby reducing or substantially eliminating the gas phase nucleation. The mean free path is longer due to selection of higher temperatures and lower pressures, as is capable of being derived by incorporation of the Ideal Gas Law.

In another embodiment, the mean free path is increased by selecting gas precursors with a smaller molecular diameter. Additionally or alternatively, the mean free path is increased by combining with inert gases, combining with other gas precursors having a smaller molecular diameter, or combining with reactive gases having a smaller diameter.

Balancing such factors to achieve the desired level of dust is performed by analyzing the impact of parameters of the process 100 in view of differential time capable of being represented with differential equations applied to equations with identified constants. For example, the below equation applies to steady-state conditions where flux to surface equals reaction flux:

$$J_1 = h_G(C_g - C_s) \quad \text{(Equation 2)}$$
$$J_2 = k_S C_s$$
$$v = \frac{C_g}{\frac{1}{h_G} + \frac{1}{k_S}}$$

where $J_1$ is flux to surface, $J_2$ is reaction flux, $C_g$ is gas concentration, $C_s$ is concentration on the surface, $h_g$ is gas phase mass transport coefficient, and $k_s$ is surface reaction rate, the surfaces being the substrate 103, the base layer 105, or the interlayer 107.

In the process 100, the concentration of the precursor gas within the enclose vessel 113 decreases over time based upon the reactivity of the selected gas and the temperature within the enclosed vessel 113. As such, the rate of deposition decreases over time. At a certain point, nucleation is as likely or more likely than deposition according to the process 100, which results in dust.

In further embodiments of the process 100, the gas phase nucleation and the deposition are balanced by monitoring parameters selected from the group consisting of time between collisions of molecules of gas and the reactant, cycle time (for example, based upon energy being pumped into the gas phase that pushes gas phase nucleation), gas concentration, surface area per unit volume of vessels or fixtures or other structural features, or a combination thereof.

The silicon-containing precursor gas(es) is/are any suitable species capable of producing the coating 121 through thermal decomposition. Gases may be gaseous or liquid at ambient temperature, so long as they thermally decompose within the process 100. Suitable gases include, but are not limited to, silane, silane and ethylene, silane and an oxidizer, dimethylsilane, trimethylsilane, dialkylsilyl dihydride, alkylsilyl trihydride, non-pyrophoric species (for example, dialkylsilyl dihydride and/or alkylsilyl trihydride), thermally reacted material (for example, carbosilane and/or carboxysilane, such as, amorphous carbosilane and/or amorphous carboxysilane), species capable of a recombination of carbosilyl (disilyl or trisilyl fragments), methyltrimethoxysilane, methyltriethoxysilane, dimethyldimethoxysilane, dimethyldiethoxysilane, trimethylmethoxysilane, trimethylethoxysilane, one or more nitrogen-containing species (for example, ammonia, nitrogen, hydrazine, trisilylamine (also known as, TSA; silanamine; N,N-disilyl-disilazane; 2-silyl-; silane, nitrilotris; or 3SA), Bis(tertiary-butylamino)silane, 1,2-bis(dimethylamino) tetramethyldisilane, and/or dichlorosilane, hexachlorodisilane), and combinations thereof. In embodiments with more than one species being introduced, the species are introduced concurrently (pre-mixed or mixed in situ) or sequentially (with either species being introduced first).

In general, the gases used in the process 100 are each part of gaseous mixtures including thermally reactive gas(es) and an inert gas. Suitable concentrations of the thermally-reactive gas(es), by volume, are between 10% and 20%, between 10% and 15%, between 12% and 14%, between 10% and 100%, between 30% and 70%, between 50% and 80%, between 70% and 100%, between 80% and 90%, between 84% and 86%, or any suitable combination, sub-combination, range, or sub-range therein.

The term "uncoated", as is used in describing the uncoated article 111, refers to not having the complete deposition of the coated article 101 encompassed by the process 100. For example, embodiments of the process 100 include the uncoated article 111 having an untreated substrate material, a treated substrate material, a cleaned substrate material, a treatment, a binder, an oxidation, any other suitable surface effect, or a combination thereof.

The coating 121 has any suitable thickness providing the desired properties for the desired application. Suitable thicknesses include, but are not limited to, between 100 nanometers and 10,000 nanometers, between 100 nanometers and 1,000 nanometers, between 100 nanometers and 800 nanometers, between 200 nanometers and 600 nanometers, between 200 nanometers and 10,000 nanometers, between 500 nanometers and 3,000 nanometers, between 500 nanometers and 2,000 nanometers, between 500 nanometers and 1,000 nanometers, between 1,000 nanometers and 2,000 nanometers, between 1,000 nanometers and 1,500 nanometers, between 1,500 nanometers and 2,000 nanometers, 800 nanometers, 1,200 nanometers, 1,600 nanometers, 1,900 nanometers, or any suitable combination, sub-combination, range, or sub-range therein. In further embodiments, thicknesses of the amorphous silicon layer 105 and/or the amorphous interlayer are individually between 100 nm and 5,000 nm, between 200 nanometers and 2,000 nanometers, between 200 nanometers and 1,000 nanometers, between 200 nanometers and 800 nanometers, between 200 nanometers and 1,500 nanometers, between 1,500 nanometers and 2,000 nanometers, 800 nanometers, 1,200 nanometers, 1,600 nanometers, 1,900 nanometers, or any suitable combination, sub-combination, range, or sub-range therein.

The process 100 is achieved at suitable temperatures and pressures to produce the coated article 101. In one embodiment, after the positioning of the uncoated article(s) 111 within the enclosed vessel 113 (step 102), the temperature within the enclosed vessel 113 is increased from a temperature below the decomposition temperature of the silicon-containing deposition gas 117 to a temperature above the decomposition temperature of the silicon-containing deposition gas 117 prior to, during, and/or after the introducing of the silicon-containing deposition gas 117 (step 104). The introducing of the silicon-containing deposition gas 117 (step 104) is in a single cycle or multiple cycles, for example with intermediate purges. In embodiments with multiple cycles, the introducing of the silicon-containing deposition gas 117 (step 104) is in two cycles, three cycles, four cycles, five cycles, six cycles, seven cycles, eight cycles, nine cycles, ten cycles, eleven cycles, twelve cycles, thirteen cycles, fourteen cycles, fifteen cycles, sixteen cycles, or any suitable combination, sub-combination, range, or sub-range therein.

In one embodiment, the temperature is greater than 200° C., greater than 300° C., greater than 350° C., greater than 370° C., greater than 380° C., greater than 390° C., greater than 400° C., greater than 410° C., greater than 420° C., greater than 430° C., greater than 440° C., greater than 450° C., greater than 500° C., between 300° C. and 450° C., between 350° C. and 450° C., between 380° C. and 450° C., between 300° C. and 500° C., between 400° C. and 500° C., or any suitable combination, sub-combination, range, or sub-range therein.

In one embodiment, the partial pressures for the gas(es) is/are between 1 Torr and 10 Torr, 1 Torr and 5 Torr, 1 Torr and 3 Torr, 2 Torr and 3 Torr, 10 Torr and 150 Torr, between 10 Torr and 30 Torr, between 20 Torr and 40 Torr, between 30 Torr and 50 Torr, between 60 Torr and 80 Torr, between 50 Torr and 100 Torr, between 50 Torr and 150 Torr, between 100 Torr and 150 Torr, less than 150 Torr, less than 100 Torr, less than 50 Torr, less than 30 Torr, or any suitable combination, sub-combination, range, or sub-range therein.

In one embodiment, the one or more gases are held at the temperature and the pressure for a period facilitating desired coverage. Suitable durations include, but are not limited to, at least 10 minutes, at least 20 minutes, at least 30 minutes, at least 45 minutes, at least 1 hour, at least 2 hours, at least 3 hours, at least 4 hours, at least 5 hours, at least 7 hours, between 10 minutes and 1 hour, between 20 minutes and 45 minutes, between 4 and 10 hours, between 6 and 8 hours, or any suitable combination, sub-combination, range, or sub-range therein.

Purging with an inert gas is capable of being performed to the enclosed vessel 113 during the process 100. For example, prior to or after the introducing of the silicon-containing deposition gas 117 (step 104) an inert gas is capable of being introduced to the enclosed vessel 113. Suitable inert gases include, but are not limited to, nitrogen, helium, and/or argon.

Oxidizing with an oxidant is capable of being performed to the enclosed vessel 113 during the process 100. For example, prior to or after the introducing of the silicon-containing deposition gas 117 (step 104) an oxidant is capable of being introduced to the enclosed vessel 113. Suitable oxidants include, but are not limited to, water (alone, with zero air, or with an inert gas), oxygen (for example, at a concentration, by weight, of at least 50%), air (for example, alone, not alone, and/or as zero air), nitrous oxide, ozone, peroxide, or a combination thereof. As used herein, the term "zero air" refers to atmospheric air having less than 0.1 ppm total hydrocarbons. The term "air" generally refers to a gaseous fluid, by weight, of mostly nitrogen, with the oxygen being the second highest concentration species within. For example, in one embodiment, the nitrogen is present at a concentration, by weight, of at least 70% (for example, between 75% and 76%) and oxygen is present at a concentration, by weight, of at least 20% (for example, between 23% and 24%).

The surface layer 109 is capable of being post-cleaned, for example, in a turbulent manner. Additionally or alternatively, cleaning techniques include water deionized flushing with sonication, polyethylene pellets are used to soak up dust (in one application, with a second confirming that no additional dust is produced), $CO_2$ spray, and/or use of a chemical with good wetting/hydrophilicity (for example, isopropanol, ammonium hydroxide+water+).

The enclosed vessel(s) 113 has any dimensions or geometry that allows the coated article 101 to be produced within the temperature and the pressures. In one embodiment, the dimensions for the enclosed vessel(s) 113 include, but are not limited to, having a minimum width of greater than 5 cm, greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes for the enclosed vessel(s) 113 include, but are not limited to, at least 1,000 $cm^3$, greater than 3,000 $cm^3$, greater than 5,000 $cm^3$, greater than 10,000 $cm^3$, greater than 20,000 $cm^3$, between 3,000 $cm^3$ and 5,000 $cm^3$, between 5,000 $cm^3$ and 10,000 $cm^3$, between 5,000 $cm^3$ and 20,000 $cm^3$, between 10,000 $cm^3$ and 20,000 $cm^3$, any other volumes capable of uniform or substantially uniform heating, or any suitable combination, sub-combination, range, or sub-range therein.

Suitable components capable of being produced into the coated article 101 include, but are not limited to, fittings (for example, unions, connectors, adaptors, other connections between two or more pieces of tubing, for example, capable of making a leak-free or substantially leak-free seal), compression fittings (including ferrules, such as, a front and back ferrule), tubing (for example, coiled tubing, tubing sections such as used to connect a sampling apparatus, pre-bent tubing, straight tubing, loose wound tubing, tightly bound tubing, and/or flexible tubing, whether consisting of the interior being coated or including the interior and the exterior being coated), valves (such as, gas sampling, liquid sampling, transfer, shut-off, or check valves, for example, including a rupture disc, stem, poppet, rotor, multi-position configuration, able to handle vacuum or pressure, a handle or stem for a knob, ball-stem features, ball valve features, check valve features, springs, multiple bodies, seals, needle valve features, packing washers, and/or stems), quick-connects, sample cylinders, regulators and/or flow-controllers (for example, including O-rings, seals, and/or diaphragms), injection ports (for example, for gas chromatographs), in-line filters (for example, having springs, sintered metal filters, mesh screens, and/or weldments), glass liners, gas chromatograph components, liquid chromatography components, components associated with vacuum systems and chambers, components associated with analytical systems, sample probes, control probes, downhole sampling containers, drilled and/or machined block components, manifolds, particles, powders, or a combination thereof.

In one embodiment, the uncoated article 111, and thus, the coated article 101 has a non-planar geometry. Exemplary non-planar geometries include having features selected from the group consisting of channels, curves, threading, vanes, protrusions, cavities, junctions, mating interfaces, and combinations thereof. In a further embodiment, all exposed surfaces of the coated article 101 include the base layer 105, the interlayer(s) 107, and the surface layer 109. As used herein, the term "exposed," with regard to "exposed surfaces," refers to any surface that is in contact with gas during the process, and is not limited to line-of-site surfaces or surfaces proximal to line-of-site directions as are seen in flow-through chemical vapor deposition processes that do not have the enclosed vessel 113. As will be appreciated by those skilled in the art, the coated article 101 is capable of being incorporated into a larger component or system (not shown), whether the larger component or the system includes other coated article 101 or not.

The substrate 103 is any suitable material(s) compatible with the process 100. Suitable metal or metallic materials include, but are not limited to, ferrous-based alloys, non-ferrous-based alloys, nickel-based alloys, stainless steels (martensitic or austenitic), aluminum alloys, composite metals, or combinations thereof. Suitable non-metal or non-metallic materials include, but are not limited to, ceramics, glass, ceramic matrix composites, or a combination thereof. Suitable materials may be tempered or non-tempered; may have grain structures that are equiaxed, directionally-solidified, and/or single crystal; may have amorphous or crystalline structures; may be foil, fibrous, polymeric, film and/or coated; or may have any suitable combination or sub-combination thereof that is capable of withstanding the operational temperatures of the process 100.

In one embodiment, the substrate 103 is or includes a composition, by weight, of up to 0.08% carbon, between 18% and 20% chromium, up to 2% manganese, between 8% and 10.5% nickel, up to 0.045% phosphorus, up to 0.03% sulfur, up to 1% silicon, and a balance of iron (for example, between 66% and 74% iron).

In one embodiment, the substrate 103 is or includes a composition, by weight, of up to 0.08% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the substrate 103 is or includes a composition, by weight, of up to 0.03% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the substrate 103 is or includes a composition, by weight, of between 14% and 17% chromium, between 6% and 10% iron, between 0.5% and 1.5% manganese, between 0.1% and 1% copper, between 0.1% and 1% silicon, between 0.01% and 0.2% carbon, between 0.001% and 0.2% sulfur, and a balance nickel (for example, 72%).

In one embodiment, the substrate 103 is or includes a composition, by weight, of between 20% and 24% chromium, between 1% and 5% iron, between 8% and 10% molybdenum, between 10% and 15% cobalt, between 0.1% and 1% manganese, between 0.1% and 1% copper, between 0.8% and 1.5% aluminum, between 0.1% and 1% titanium, between 0.1% and 1% silicon, between 0.01% and 0.2% carbon, between 0.001% and 0.2% sulfur, between 0.001% and 0.2% phosphorus, between 0.001% and 0.2% boron, and a balance nickel (for example, between 44.2% and 56%).

In one embodiment, the substrate 103 is or includes a composition, by weight, of between 20% and 23% chromium, between 4% and 6% iron, between 8% and 10% molybdenum, between 3% and 4.5% niobium, between 0.5% and 1.5% cobalt, between 0.1% and 1% manganese, between 0.1% and 1% aluminum, between 0.1% and 1% titanium, between 0.1% and 1% silicon, between 0.01% and 0.5% carbon, between 0.001% and 0.02% sulfur, between 0.001% and 0.02% phosphorus, and a balance nickel (for example, 58%).

In one embodiment, the substrate 103 is or includes a composition, by weight, of between 25% and 35% chromium, between 8% and 10% iron, between 0.2% and 0.5% manganese, between 0.005% and 0.02% copper, between 0.01% and 0.03% aluminum, between 0.3% and 0.4% silicon, between 0.005% and 0.03% carbon, between 0.001% and 0.005% sulfur, and a balance nickel (for example, 59.5%).

In one embodiment, the substrate 103 is or includes a composition, by weight, of between 17% and 21%, between 2.8% and 3.3%, between 4.75% and 5.5% niobium, between 0.5% and 1.5% cobalt, between 0.1% and 0.5% manganese, between 0.2% and 0.8% copper, between 0.65% and 1.15% aluminum, between 0.2% and 0.4% titanium, between 0.3% and 0.4% silicon, between 0.01% and 1% carbon, between 0.001 and 0.02% sulfur, between 0.001 and 0.02% phosphorus, between 0.001 and 0.02% boron, and a balance nickel (for example, between 50% and 55%).

In one embodiment, the substrate 103 is or includes a composition, by weight, of between 2% and 3% cobalt, between 15% and 17% chromium, between 5% and 17% molybdenum, between 3% and 5% tungsten, between 4% and 6% iron, between 0.5% and 1% silicon, between 0.5% and 1.5% manganese, between 0.005 and 0.02% carbon, between 0.3% and 0.4% vanadium, and a balance nickel.

In one embodiment, the substrate 103 is or includes a composition, by weight, of up to 0.15% carbon, between 3.5% and 5.5% tungsten, between 4.5% and 7% iron, between 15.5% and 17.5% chromium, between 16% and 18% molybdenum, between 0.2% and 0.4% vanadium, up to 1% manganese, up to 1% sulfur, up to 1% silicon, up to 0.04% phosphorus, up to 0.03% sulfur, and a balance nickel.

In one embodiment, the substrate 103 is or includes a composition, by weight, of up to 2.5% cobalt, up to 22% chromium, up to 13% molybdenum, up to 3% tungsten, up to 3% iron, up to 0.08% silicon, up to 0.5% manganese, up to 0.01% carbon, up to 0.35% vanadium, and a balance nickel (for example, 56%).

In one embodiment, the substrate 103 is or includes a composition, by weight, of between 1% and 2% cobalt, between 20% and 22% chromium, between 8% and 10% molybdenum, between 0.1% and 1% tungsten, between 17% and 20% iron, between 0.1% and 1% silicon, between 0.1% and 1% manganese, between 0.05 and 0.2% carbon, and a balance nickel.

In one embodiment, the substrate 103 is or includes a composition, by weight, of between 0.01% and 0.05% boron, between 0.01% and 0.1% chromium, between 0.003% and 0.35% copper, between 0.005% and 0.03% gallium, between 0.006% and 0.8% iron, between 0.006% and 0.3% magnesium, between 0.02% and 1% silicon+iron, between 0.006% and 0.35% silicon, between 0.002% and 0.2% titanium, between 0.01% and 0.03% vanadium+titanium, between 0.005% and 0.05% vanadium, between 0.006% and 0.1% zinc, and a balance aluminum (for example, greater than 99%).

In one embodiment, the substrate 103 is or includes a composition, by weight, of between 0.05% and 0.4% chromium, between 0.03% and 0.9% coper, between 0.05% and 1% iron, between 0.05% and 1.5% magnesium, between 0.5% and 1.8% manganese, between 0.5% and 0.1% nickel, between 0.03% and 0.35% titanium, up to 0.5% vanadium, between 0.04% and 1.3% zinc, and a balance aluminum (for example, between 94.3% and 99.8%).

In one embodiment, the substrate 103 is or includes a composition, by weight, of between 0.0003% and 0.07% beryllium, between 0.02% and 2% bismuth, between 0.01% and 0.25% chromium, between 0.03% and 5% copper, between 0.09% and 5.4% iron, between 0.01% and 2% magnesium, between 0.03% and 1.5% manganese, between 0.15% and 2.2% nickel, between 0.6% and 21.5% silicon, between 0.005% and 0.2% titanium, between 0.05% and 10.7% zinc, and a balance aluminum (for example, between 70.7% to 98.7%).

In one embodiment, the substrate 103 is or includes a composition, by weight, of between 0.15% and 1.5% bismuth, between 0.003% and 0.06% boron, between 0.03% and 0.4% chromium, between 0.01% and 1.2% copper, between 0.12% and 0.5% chromium+manganese, between 0.04% and 1% iron, between 0.003% and 2% lead, between 0.2% and 3% magnesium, between 0.02% and 1.4% manganese, between 0.05% and 0.2% nickel, between 0.5% and 0.5% oxygen, between 0.2% and 1.8% silicon, up to 0.05% strontium, between 0.05% and 2% tin, between 0.01% and 0.25% titanium, between 0.05% and 0.3% vanadium, between 0.03% and 2.4% zinc, between 0.05% and 0.2% zirconium, between 0.150 and 0.2% zirconium+titanium, and a balance of aluminum (for example, between 91.7% and 99.6%).

In one embodiment, the substrate 103 is or includes a composition, by weight, of between 0.4% and 0.8% silicon, up to 0.7% iron, between 0.15% and 0.4% copper, up to 0.15% manganese, between 0.8% and 1.2% magnesium, between 0.04% and 0.35% chromium, up to 0.25% zinc, up to 0.15% titanium, optional incidental impurities (for example, at less than 0.05% each, totaling less that 0.15%), and a balance of aluminum (for example, between 95% and 98.6%).

In one embodiment, the substrate 103 is or includes a composition, by weight, of between 11% and 13% silicon, up to 0.6% impurities/residuals, and a balance of aluminum.

EXAMPLES

In a first experiment, a stainless steel coupon was coated at 390° C. at a pressure of 7.75 psia for four 30-minute cycles. The coated stainless steel coupon resulted in a coating substantially free of silicon dust, but with dust at a minute concentration of, per 100 square micrometers, greater than 6 particles having a dimension of greater than 0.5 micrometers.

In a second experiment, a stainless steel coupon was coated at 410° C. at a pressure of 3.87 psia for four 45-minute cycles. The coated stainless steel coupon resulted in a coating substantially free of silicon dust, but with dust at a minute concentration of, per 100 square micrometers, greater than 6 particles having a dimension of greater than 0.5 micrometers.

In a third experiment, a stainless steel coupon was coated at 410° C. at a pressure of 2.32 psia for four 45-minute cycles. The coated stainless steel coupon resulted in a coating substantially free of silicon dust, but with dust at a minute concentration of, per 100 square micrometers, greater than 6 particles having a dimension of greater than 0.5 micrometers.

In a fourth experiment, a stainless steel coupon was coated at 410° C. at a pressure of 3.87 psia for four 300-minute cycles. The coated stainless steel coupon resulted in a coating having a substantial amount of silicon dust.

In a fifth experiment, a stainless steel coupon was coated at 410° C. at a pressure of 2.61 psia for fifteen 30-minute cycles. The coated stainless steel coupon resulted in a coating having a an amount of silicon dust at a concentration of, per 100 square micrometers, less than 6 particles having a dimension of greater than 0.5 micrometers, as shown in FIG. 2.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A liquid chromatography system, comprising:
   a liquid chromatography component, comprising:
      a substrate; and an amorphous coating on the substrate, wherein the amorphous coating is positioned on regions of the liquid chromatography component that are unable to be concurrently coated through line-of-sight techniques;
   wherein the amorphous coating comprises carbon, hydrogen, silicon, and oxygen and includes less than 6 particles having a dimension of greater than 0.5 micrometers within a 100 square micrometer region.

2. The liquid chromatography system of claim 1, wherein the substrate is metal or metallic.
3. The liquid chromatography system of claim 1, wherein the substrate is stainless steel.
4. The liquid chromatography system of claim 1, wherein the substrate is an aluminum alloy.
5. The liquid chromatography system of claim 1, wherein the substrate includes titanium.
6. The liquid chromatography system of claim 1, wherein the substrate includes, by weight, at least 15% cobalt.
7. The liquid chromatography system of claim 1, wherein liquid chromatography component is tubing.
8. The liquid chromatography system of claim 1, wherein liquid chromatography component has channels.
9. The liquid chromatography system of claim 1, wherein liquid chromatography component has curves.
10. The liquid chromatography system of claim 1, wherein liquid chromatography component has threading.
11. The liquid chromatography system of claim 1, wherein liquid chromatography component has protrusions.
12. The liquid chromatography system of claim 1, wherein liquid chromatography component has cavities.
13. The liquid chromatography system of claim 1, wherein liquid chromatography component has junctions.
14. The liquid chromatography system of claim 1, wherein liquid chromatography component has mating surfaces.
15. The liquid chromatography component of claim 1.
16. The liquid chromatography system of claim 1, wherein the substrate is metal or metallic.
17. The liquid chromatography system of claim 1, wherein the substrate is stainless steel.
18. The liquid chromatography component of claim 1.
19. A liquid chromatography system, comprising:
    a liquid chromatography component having a non-line-of-sight geometry, the liquid chromatography component comprising:
       a substrate; and
       an amorphous coating on the substrate throughout the non-line-of-sight geometry,
    wherein the amorphous coating comprises carbon, hydrogen, silicon, and oxygen and includes less than 6 particles having a dimension of greater than 0.5 micrometers within a 100 square micrometer region;
    wherein the substrate is stainless steel.
20. A liquid chromatography system, comprising:
    a liquid chromatography component having a non-line-of-sight geometry, the liquid chromatography component comprising:
       a stainless steel substrate; and
       an amorphous coating on the stainless steel substrate throughout the non-line-of-sight geometry,
    wherein the amorphous coating comprises carbon, hydrogen, silicon, and oxygen and includes less than 6 particles having a dimension of greater than 0.5 micrometers within a 100 square micrometer region;
    wherein the substrate is stainless steel.

* * * * *